(12) United States Patent
Dietz et al.

(10) Patent No.: US 8,694,294 B2
(45) Date of Patent: Apr. 8, 2014

(54) AUTOMATED COMPUTERIZED METHOD TO DETERMINE THE CONDUCTOR STRUCTURE OF A GRADIENT COIL

(75) Inventors: Peter Dietz, Fuerth (DE); Andreas Krug, Fuerth (DE)

(73) Assignee: Siemens Aktiengesellschaft, Munich (DE)

( * ) Notice: Subject to any disclaimer, the term of this patent is extended or adjusted under 35 U.S.C. 154(b) by 610 days.

(21) Appl. No.: 12/725,825

(22) Filed: Mar. 17, 2010

(65) Prior Publication Data
US 2010/0256968 A1    Oct. 7, 2010

(30) Foreign Application Priority Data
Mar. 24, 2009    (DE) .......................... 10 2009 014 539

(51) Int. Cl.
*G06G 7/48*    (2006.01)

(52) U.S. Cl.
USPC ........................................ 703/6; 703/3; 703/4

(58) Field of Classification Search
USPC ............................................................. 703/6
See application file for complete search history.

(56) References Cited

U.S. PATENT DOCUMENTS

| 5,309,107 | A | * | 5/1994 | Pausch | 324/318 |
| 6,903,550 | B2 | * | 6/2005 | Uetake | 324/307 |
| 7,196,603 | B2 | | 3/2007 | Dodd | |
| 2004/0227511 | A1 | * | 11/2004 | Havens et al. | 324/309 |
| 2006/0038566 | A1 | * | 2/2006 | Kimmlingen et al. | 324/318 |

FOREIGN PATENT DOCUMENTS

DE    10 2007 025 096 A1    8/2009

* cited by examiner

*Primary Examiner* — David Silver
(74) *Attorney, Agent, or Firm* — Schiff Hardin LLP

(57) ABSTRACT

In a computerized, automated method to determine the conductor structure of a gradient coil of a magnetic resonance device, the conductor structure is determined depending on the theoretical oscillation response of at least one metallic structure of the magnetic resonance device that is arranged adjacent to the gradient coil at the installation point, with the oscillation response of the metallic structure being determined dependent on theoretical eddy currents generated in the structure by the gradient coil.

8 Claims, 2 Drawing Sheets

AUTOMATED COMPUTERIZED METHOD TO DETERMINE THE CONDUCTOR STRUCTURE OF A GRADIENT COIL

BACKGROUND OF THE INVENTION

1. Field of the Invention

The present invention concerns a method implemented in a computer (processor) to determine the conductor structure of a gradient coil of a magnetic resonance device.

2. Description of the Prior Art

In magnetic resonance tomography, gradient coils are used for slice selection and for spatial coding of the signal. For this purpose, a magnetic resonance imaging device typically has three gradient coils in the form of a gradient coil arrangement, wherein the gradient fields generated by the individual gradient coils are orthogonal to one another. Furthermore, it is typical that the gradient fields generated by the gradient coils proceed perpendicularly to or parallel to the magnetic field of the basic field magnet. These gradient fields generated by the gradient coils can be considered as a type of basic gradient fields. Arbitrary gradient fields can then be generated in arbitrary spatial directions by superimposing the individual basic gradient fields.

In closed systems that are designed cylindrically as a whole and also have a cylindrical central bore, all larger structures (such as gradient coils, cryostat and vacuum container) circularly surround the bore in an essentially concentric design.

Although given such an arrangement the conductor structure can be located on a cylindrical surface, the conductor structure of a gradient coil does not completely surround the bore.

The gradient field of a gradient coil that is generated by means of the conductor structure should simultaneously satisfy multiple criteria. The gradient field should exhibit an optimally good linearity in the examination area. Only with a linear gradient field can a precise slice selection and a useful spatial coding be achieved. Second, the gradient field generated by the gradient coil should exhibit a specific minimum strength. The achievable resolution of the image data acquired with the magnetic resonance device depends on the strength of the gradient field. The higher the gradient strength, the greater the achievable resolution capability. Third, the switching time required for activating the gradient fields should be optimally short. In fast imaging sequences, the switching time affects the echo time to a significant degree, which is why the gradient coil should be able to bring the gradient field to its desired amplitude as quickly as possible. Last but not least, the gradient coil should generate the gradient field at best only within the examination volume while outside of this volume no fields should be generated in the optimal case.

It is the last requirement that, understandably, cannot be satisfied in reality. This is because, a gradient coil generates eddy currents in the surrounding metallic structures, and these eddy currents lead to oscillations and therefore also to the development of noise, for example. In order to minimize the generation of eddy currents in structures outside of the gradient coil, it is known to use a technique called active shielding. This technique makes use located of coils that are arranged outside of the gradient coil arrangement. A current of the same strength as that through the gradient coils flows through these compensation coils, so the respective magnetic fields of the compensation coils and the gradient coils essentially cancel one another in the outer region. Through such active shielding, the formation of eddy currents in metal structures of a magnet (such as a cryoshield and vacuum tank) can be minimized but not completely prevented. Therefore, as before it is sought to keep the eddy currents generated by the gradient coil in the metallic structures surrounding the gradient coil as small as possible.

Moreover, a particular problem is to satisfy this criterion in measurement (data acquisition) protocols in which the gradient coils must be switched extremely rapidly, so the switching frequency generates eddy currents at a frequency in the range of the frequencies of the natural oscillation modes of the metallic structures of the magnetic resonance device. Such critical switching cycles can be prevented only by specific parameters controlling the data acquisition not being permitted to occur. For example, this means that the commonly-used echo-planar imaging (EPI) sequence cannot be operated with specific repetition times or echo times in a magnetic resonance device of a specific type. The echo times and repetition times vary somewhat depending on the design of the magnetic resonance device. The operation of the magnetic resonance devices is accordingly limited.

Due to the multiple criteria to be satisfied, there are conflicts in the optimization of the conductor structure of the gradient coil, to the effect that all requirements cannot be optimally satisfied simultaneously. The design of a gradient coil arrangement is thus a classical multiple goal optimization problem, wherein under the circumstances a gain (for example in the linear of the gradient field generated by the gradient coil) is purchased with stronger eddy currents.

SUMMARY OF THE INVENTION

An object of the present invention is to provide a computerized automated method to determine the conductor structure of a gradient coil, wherein the conductor structure that is thereby determined further improves the response (behavior) of the gradient coil.

To achieve this object, in a method according to the invention by executing a design algorithm in a computer that determines the conductor structure depending on the theoretical oscillation response of at least one metallic structure of the magnetic resonance device that is arranged adjacent to the gradient coil at the installation site, the oscillation response of the metallic structure depending on the theoretical eddy currents generated in the structure by the gradient coil.

The method according to the invention accordingly does not have the conventional goal of minimizing the eddy currents that are generated in the metallic structures of the magnetic resonance device overall. Eddy currents are permitted to arise, even at greater strength, but at locations where they do no harm.

The determination of a conductor structure ensues automatically and with the assistance of a computer. For example, models of the known metallic structures of the magnetic resonance device can be used as boundary conditions. For example, modeling the cryoshield that is used in the form of a linked grid is typical in such calculations. The essential (basic) features of the magnetic resonance device are thus taken into account as an example. The calculation is described in further detail in the following.

Instead of minimizing the eddy currents in the cryoshield (or any other metallic structure of the magnetic resonance device), as is known, according to the invention the oscillation response of the metallic structures—which naturally depends on the theoretically generated eddy currents—is taken into account in the determination of the conductor structure.

The actual embodiment of the conductor structure is thus dependent on a number of factors that are in principle unknown, which first become known by specification of a physical structure, such as a cryoshield with specific dimensions in a magnetic resonance device of a specific field strength, which is why a predetermined design of the conductor structure cannot be specified in advance. Additionally, it must be considered that the individual gradient coils of the gradient coil arrangement itself can assume different embodiments. For example, normally Helmholtz coils are used to generate a gradient field running in the direction of the basic magnetic field. By contrast, gradient fields perpendicular to the basic magnetic field are generated by gradient coils in the form of saddle coils. Therefore the embodiment of the gradient coil is sufficiently defined by the goal to be achieved.

The conductor structure can advantageously be determined depending on a predefined number of oscillation modes of the metallic structure of the magnetic resonance device. The eddy currents generated in the metallic structures upon switching the gradient coils lead to Lorentz forces that induce the structures to oscillate. The oscillations that thereby form are not entirely random; rather, only specific oscillation patterns can develop. The fundamental oscillation and an arbitrary number of harmonics represent each oscillation mode. It is suggested that twenty oscillation modes be taken into account in the method according to the invention. Given this number, all relevant oscillation modes are taken into account without unnecessarily extending the calculation time required to calculate the conductor structure.

In this way the oscillation modes of a single metallic structure can be taken into account. As is likewise known from the field of wave physics, however, oscillation systems composed of individual components that exhibit different spring stiffnesses (spring constants) can exhibit more complicated oscillation patterns than just the natural oscillations of the individual components. Therefore the conductor structure can be particularly advantageously determined depending on a predetermined number of oscillation modes of at least two adjacent metallic structures of the magnetic resonance device, considered as coupled oscillation modes. Multiple metallic structures (for example the cryoshield and the vacuum tank) that exhibit natural oscillations that are specific to them are considered as a coupled system. This known coupled system then exhibits entirely new (difference) natural oscillations that, although they depend on the natural oscillations of the individual metallic structures, do not arise from the oscillation modes of a single structure through a simple multiplication, for example.

The conductor structure can advantageously be determined depending on at least one deflection of the metallic structure that is moved by eddy currents generated by the gradient coil. Since, according to the invention, the conductor structure of the gradient coil is not fashioned to minimize the strength of the generated eddy currents, it is important to consider the deflection of a metallic structure that is generated by the eddy currents. For example, the deflection generated by the eddy currents produces a pressure change in the helium tank as well as an energy input into the helium contained in the helium tank. This can lead to boiling of the helium and to helium vaporization. The gradient coils or the gradient fields generated thereby in the metallic structures of the magnetic resonance device thus may generate eddy currents, but the deflection of the metallic structures should remain minimal.

The conductor structure can advantageously be determined depending on at least one force component acting on the metallic structure, which force component is generated by the eddy currents. This takes into account that the metallic structure exhibits a certain inherent stability, and not every eddy current equally leads to a deflection, or to a strong deflection of the metallic structure.

The conductor structure can ideally be calculated depending on the minimization of the sum of the force components weighted with the deflections. The deflection is thus multiplied with the force component for every natural oscillation of the metallic structure or, respectively, coupled metallic structures. Within the scope of the calculation this naturally occurs for individual grid points of the network that represents the metallic structure. However, ultimately it is not the effect of the eddy currents on a single natural oscillation that is of interest, but rather the total effect on all considered oscillation modes.

This total effect is summarized in the form of a mathematical summation.

The effects of an eddy current generated by the gradient coil in a metallic structure also depend on how strong the surrounding field of the basic magnet is as well as how significant the variations (inhomogeneity) of the basic field are. Therefore the conductor structure can advantageously be calculated depending on the spatial distribution of at least one theoretical magnetic field gradient of the basic magnetic field of the magnetic resonance device. The distribution of the basic magnetic field is naturally known and can therefore be considered as a boundary condition in calculations to determine the conductor structure of a gradient coil.

DESCRIPTION OF THE PREFERRED EMBODIMENTS

Figure 1:
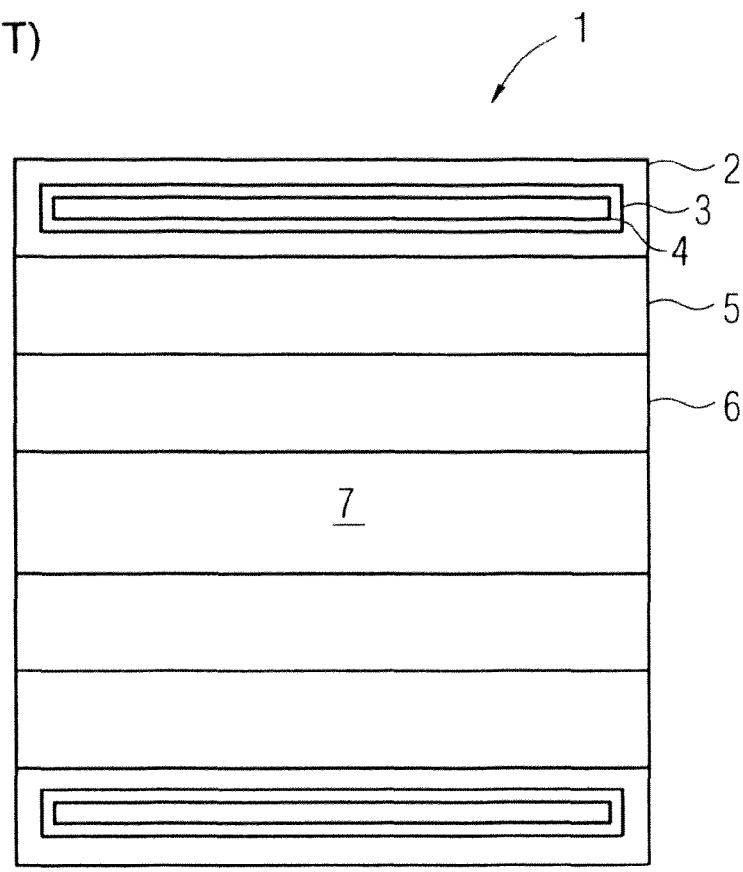
FIG. 1 schematically illustrates the basic components of a magnetic resonance scanner (data acquisition unit).

FIG. 1 shows a magnetic resonance scanner 1 in cross section. The magnetic resonance scanner 1 has an essentially cylindrical shape, wherein the individual devices are designed concentric to one another. Located toward the outside are the vacuum tank 2 with cryoshield 3 and basic field coil housing 4, while the gradient coil arrangement 5 and the radio-frequency coil 6 follow further inwardly. The bore 7 for patient accommodation is in the middle of the magnetic resonance scanner 1.

The gradient coil arrangement 5 itself is composed of multiple gradient coils to generate respective gradient fields in different spatial directions. The gradient coil arrangements itself is frequently designated as a "gradient coil" although it is formed of significantly more devices than a single coil.

Figure 2:
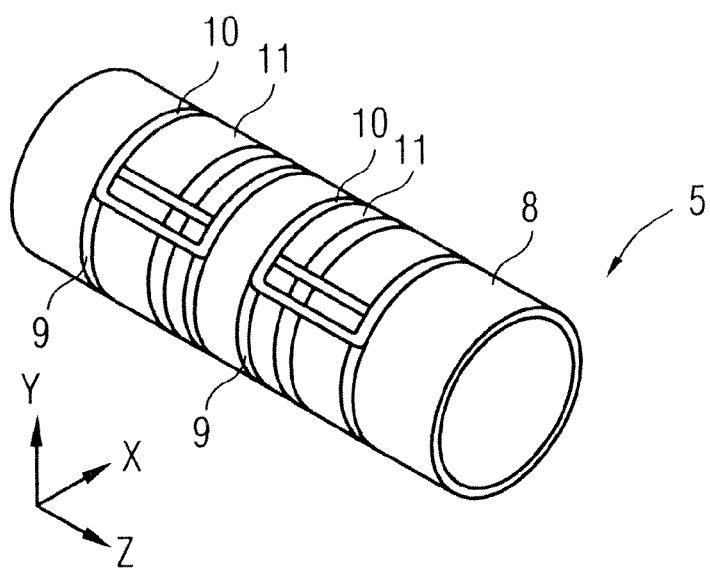
FIG. 2 schematically illustrates a gradient coil arrangement.

FIG. 2 shows a gradient coil arrangement 5 having a support tube 8, an x-coil 9, a y-coil 10 and a z-coil 11. When the term gradient coil is used herein it refers to such an arrangement 5. Individual coils are represented by the x-coil 9, y-coil 10 and the z-coil 11. Their embodiment is here shown merely as an example. The entire complex, which includes even more components as is known to those skilled in the art, is designated as the gradient coil arrangement 5 herein.

Figure 3:
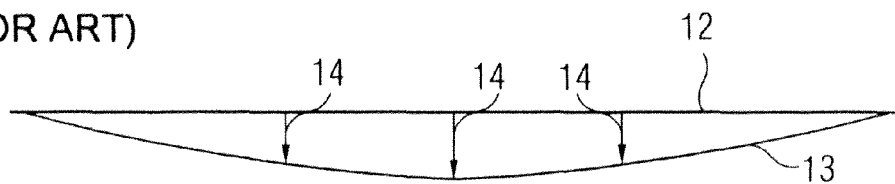
FIG. 3 shows the basic oscillation of a metallic structure.

FIG. 3 shows in simplified form a metallic structure 12 that moves out of a rest position due to the effect of eddy currents.

The metallic structure 12 schematically represents a portion of a wall (for example of the vacuum tank 2) in cross-section. The metallic structure 12 can also represent any other side wall of a metallic structure of the magnetic resonance scanner 1; it can additionally also represent multiple metallic devices of the magnetic resonance scanner 1 if such a combination of metallic devices exhibits a coupled oscillation response.

Due to the resulting Lorentz forces, the eddy currents induced in the metallic structure 12 produce a deflection of the metallic structure 12. Here the basic oscillation 13 is shown as an example, wherein the deflection 14 falls off at different rates dependent on the location (distance).

Figure 4:
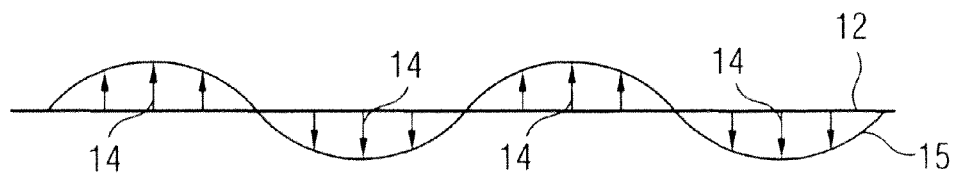
FIG. 4 shows a harmonic of a metallic structure.

In addition to the basic oscillation, harmonics can also be caused by the Lorentz forces. The third harmonic 15 is shown in FIG. 4.

The oscillation response of the metallic structure (which is known in terms of its position and geometry) enters as a model into the determination of the conductor structure of a gradient coil. The theoretical oscillation response of the metallic structures is known or is calculable, and thus the oscillation response of a real structure does not need to be considered.

Figure 5:
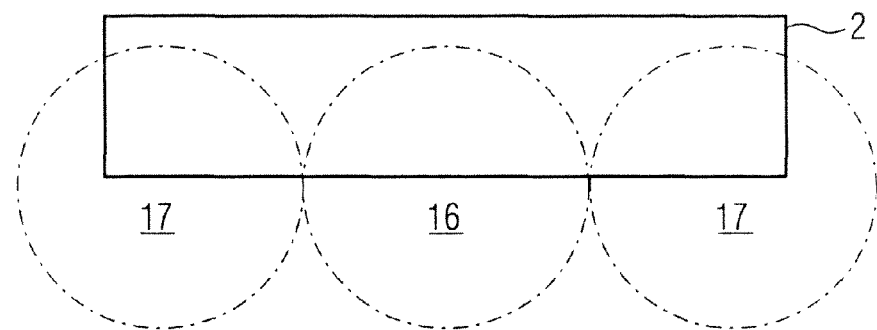
FIG. 5 shows a portion of the magnetic resonance scanner of FIG. 1 with regions identified that are relevant to the invention method.

The magnetic resonance field generated by the basic field coil represents an additional factor to be considered. This is homogeneous only in the region of the bore 7 and even there is not homogeneous over the entire extent, but rather only in the central region. FIG. 5 schematically shows the magnetic field around the vacuum tank 2. There is a region 16 in the center in which a lower field strength is present and outer regions 17 in which the field strength is greater. Given a 1.5 T magnet, field strengths of approximately 4.5 T exist in the regions 17 while only approximately 2.5 T is prevalent in the region 16. These numerical values and region divisions are only exemplary representations in order to show the gradient fields present solely to generate the basic magnetic field in the region of the vacuum tank 2.

These gradients are taken into account in the determination of the conductor structure since the eddy currents generated by a gradient coil are problematical because of the Lorentz force that develops only in the presence of magnetic field gradients.

However, the deflections produced by the Lorentz forces also depend on the oscillation modes of the structures in which the eddy currents arise.

In the following the procedure to determine the conductor structure of a gradient coil is described in detail. An optimization of the current distribution is implemented in order to achieve the predetermined boundary conditions—such as the linearity of the gradient field, its minimum rise time and eddy current effects in the homogeneous central region of the magnetic resonance device—within the framework of the predetermined geometry. For this a weighted sum of inductance, linearity and eddy current effects is selected as a target function. These quantities are input as secondary conditions into the optimization algorithm. The consideration of the oscillation response of a metallic structure of the magnetic resonance device (for example of the cryoshield) ensues by linking the corresponding structure and the possible conductor structures of the gradient coil. This is typically modeled in software for calculation of finite elements, such as ANSYS. The cryoshield and the conductor structure are determined as grid points of a network on a cylinder surface or a portion of a cylinder surface. The eddy currents in the cryoshield or in any other metallic (and therefore conductive) structure of the magnet are calculated by the coupling inductance of the possible conductor structures of the gradient coil (i.e. the network of the gradient coil) being calculated with the eddy current-carrying surface. The coupling inductance of a mesh of the eddy current-carrying surface with all remaining meshes of the eddy current-carrying surface is calculated based on this. The eddy current in this mesh is calculated as a product of the inverse of this coupling inductance and the product of the current in the meshes of the gradient coil conductor structure and the coupling inductance of coil and eddy current-carrying surface. The eddy current in the eddy current-carrying surface is thus a linear function of the current, wherein the current represents the optimization variable.

The Lorentz force on the eddy current-carrying surface is calculated according to $F=I \times B$ as a cross product of this eddy current and the magnetic field of the basic magnet at the point of the current. By multiplying this Lorentz force with the possible deflection of the eddy current-carrying surface, the participation factor of the current distribution for this deflection is obtained. This participation factor is a measure of the strength of the excitation of this oscillation mode.

The participation factor can be calculated for each oscillation mode according to the following equation:

$$PF = \sum_r U_r \cdot F_r$$

In the equation the deflection at location r is designated as U and the force caused by the eddy currents at the location r is designated as F. The metallic structure 12 is divided in an exemplary manner into discrete nodes (sampling points) in order to encompass all deflections and force effects for the basic oscillation, for example. These discrete nodes are then used again as index r in the determination of the conductor structure. When an oscillation mode is summed over all nodes, the participation factor is obtained. If a specific number of oscillation modes (for example twenty) are taken into account, twenty participation factors are thus obtained. The sum of all participation factors is called the participation factor sum at this point. This enters as an additional boundary condition into the determination of the conductor structure of a gradient coil, wherein the participation factor sum is to be minimized.

Each participation factor is a linear function of the current in the gradient coil structure; it can therefore be taken into account as a linear secondary condition in the optimization of the gradient coil and in the determination of the conductor structure of a gradient coil.

The minimization of the excitation of the oscillations of a metallic structure of the magnetic resonance scanner 1 is a weaker requirement than the minimization of the generated eddy currents; greater freedoms thus exist with regard to the other factors to be optimized, for instance the linearity of the gradient field. The performance of a gradient coil can thereby be increased without problems occurring due to eddy currents at another point.

Although modifications and changes may be suggested by those skilled in the art, it is the intention of the inventors to embody within the patent warranted hereon all changes and modifications as reasonably and properly come within the scope of their contribution to the art.

We claim as our invention:

1. An automated, computerized method to design a conductor configuration of a gradient coil of a magnetic resonance data acquisition device, said method comprising:

for a specific magnetic resonance data acquisition device for which a conductor configuration of a gradient coil is to be designed, identifying an electrical conducting structure of said magnetic resonance data acquisition device that is subject to oscillation when said gradient coil is operated to participate in acquisition of magnetic resonance data by said magnetic resonance data acquisition device with simultaneous generation of a static, homogenous magnetic field in said magnetic resonance data acquisition device, said oscillation arising from Lorentz forces acting on said electrically conductive structure due to eddy currents in said electrically conductive structure caused by a current in said conductor configuration during, said operation of said gradient coil, interacting with said static, homogenous magnetic field;

in a computer, automatically executing an algorithm to design said conductor configuration of said gradient coil for said specific magnetic resonance data acquisition device by solving a classified multi-objective optimization problem having multiple boundary conditions;

in execution of said algorithm in said computer, automatically calculating said eddy currents, that are caused in said electrically conductive structure by said operation of said gradient coil and, from the calculated eddy currents and known attributes of said static, homogenous magnetic field, mathematically representing an oscillation response of said electrically conductive structure to said operation of said gradient coil;

executing said algorithm in said computer using, as one of said boundary conditions, the calculated oscillation response of said electrically conductive structure and calculating said configuration of said conductor structure of said gradient coil, as a solution to said optimization problem, that produces eddy currents in said electrically conductive structure that cause an oscillation of said electrically conductive structure that does substantially no harm to said magnetic resonance data acquisition device; and making a representation of the conductor configuration determined in the computer, as a solution to said optimization problem, available at an output of the computer in a form providing information to manufacture a physical gradient coil for said magnetic resonance data acquisition device with a conductor having said conductor configuration.

2. A method as claimed in claim 1 comprising, in executing said algorithm in said computer, calculating said oscillation response as a predetermined number of normal oscillation modes of natural frequencies said electrically conductive structure, and solving said optimization problem to determine said conductor configuration dependent on said predetermined number of natural oscillation modes of said electrically conductive structure.

3. A method as claimed in claim 1 comprising executing said algorithm in said computer to calculate said oscillation response as a predetermined number of respective normal oscillation modes of respective natural frequencies at least two adjacent electrically conductive structures of said magnetic resonance data acquisition device, as coupled oscillation modes, and solving said optimization problem to determine said conductor configuration dependent on said predetermined number of normal oscillation modes of said at least two adjacent electrically conductive structures of said magnetic resonance data acquisition device, as coupled oscillation modes.

4. A method as claimed in claim 1 comprising executing said algorithm in said computer to determine said oscillation response as a mechanical deflection of said electrically conductive structure produced by said Lorentz forces, and solving said optimization problem to determine said conductor configuration dependent on said mechanical deflection of said electrically conductive structure produced by said Lorentz forces.

5. A method as claimed in claim 1 comprising executing said algorithm in said computer to calculate said oscillation response as a response to at least one force component of said Lorentz forces, and solving said optimization problem to determine said conductor structure dependent on at said least one force component of said Lorentz forces that acts on said electrically conductive structure.

6. A method as claimed in claim 5 comprising executing said algorithm in said computer to calculate said oscillation response as respective deflections of said electrically conductive structure produced by respective force components of said Lorentz forces acting on said electrically conductive structure, and solving said optimization problem to determine said conductor configuration dependent on said respective deflections of said electrically conductive structure produced by respective force components of said Lorentz forces acting said electrically conductive structure, by minimizing a sum of said force components weighted by said deflections.

7. A method as claimed in claim 1 comprising in executing said algorithm in said computer, using, as said known attribute of said static, homogenous magnetic field, a spatial distribution of at least one magnetic field gradient of said static, homogenous magnetic field in said magnetic resonance data acquisition device.

8. A gradient coil for a magnetic resonance data acquisition device, said gradient coil having a conductor structure generated according to the method of claim 1.

* * * * *